United States Patent
Chen et al.

(10) Patent No.: US 11,171,199 B2
(45) Date of Patent: Nov. 9, 2021

(54) METAL-INSULATOR-METAL CAPACITORS WITH HIGH BREAKDOWN VOLTAGE

(71) Applicant: Taiwan Semiconductor Manufacturing Co., Ltd., Hsinchu (TW)

(72) Inventors: Wei-Ting Chen, Hsinchu (TW); Tsung-Han Tsai, Miaoli County (TW); Kun-Tsang Chuang, Miaoli (TW); Po-Jen Wang, Taichung (TW); Ying-Hao Chen, Tainan (TW); Chien-Cheng Huang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/549,835

(22) Filed: Aug. 23, 2019

(65) Prior Publication Data
US 2021/0057517 A1    Feb. 25, 2021

(51) Int. Cl.
*H01L 49/02* (2006.01)
*H01L 21/02* (2006.01)
*H01L 21/3213* (2006.01)

(52) U.S. Cl.
CPC .......... *H01L 28/60* (2013.01); *H01L 21/0217* (2013.01); *H01L 21/0234* (2013.01); *H01L 21/02326* (2013.01); *H01L 21/32136* (2013.01)

(58) Field of Classification Search
CPC .......... H01L 28/60; H01L 21/0217; H01L 21/02326; H01L 21/0234; H01L 21/32136
See application file for complete search history.

(56) References Cited

U.S. PATENT DOCUMENTS

| 6,894,335 | B2 | 5/2005 | LaFleur |
| 7,763,519 | B2 | 7/2010 | Barth et al. |
| 9,373,675 | B2 | 6/2016 | Lin et al. |
| 2005/0062130 | A1* | 3/2005 | Ciancio ............... H01L 23/5223 257/532 |
| 2007/0166943 | A1 | 7/2007 | Shin |

(Continued)

FOREIGN PATENT DOCUMENTS

| CN | 1738025 A | 2/2006 |
| CN | 103247698 A | 8/2013 |

(Continued)

OTHER PUBLICATIONS

Office Action, dated Mar. 23, 2021, for Korean Intellectual Property Office Appl. No. 10-2019-0149953, 7 pages.

(Continued)

*Primary Examiner* — Vongsavanh Sengdara
(74) *Attorney, Agent, or Firm* — Sterne, Kessler, Goldstein & Fox P.L.L.C.

(57) ABSTRACT

The present disclosure relates to an apparatus that includes a bottom electrode and a dielectric structure. The dielectric structure includes a first dielectric layer on the bottom electrode and the first dielectric layer has a first thickness. The apparatus also includes a blocking layer on the first dielectric layer and a second dielectric layer on the blocking layer. The second dielectric layer has a second thickness that is less than the first thickness. The apparatus further includes a top electrode over the dielectric structure.

20 Claims, 9 Drawing Sheets

(56) References Cited

U.S. PATENT DOCUMENTS

2014/0042590 A1* 2/2014 Chen .................. H01L 29/92
                                                257/532
2019/0157378 A1* 5/2019 Luo .................... H01L 27/0629
2019/0355804 A1* 11/2019 Park ................. C23C 16/45534

FOREIGN PATENT DOCUMENTS

| KR | 20070076252 A | 7/2007 |
| KR | 20190132139 A | 11/2019 |
| TW | 200306006 A | 11/2003 |

OTHER PUBLICATIONS

Office Action, dated Sep. 2, 2021, for Taiwan Intellectual Property Office Appl. No. 109128667, 5 pages.

* cited by examiner

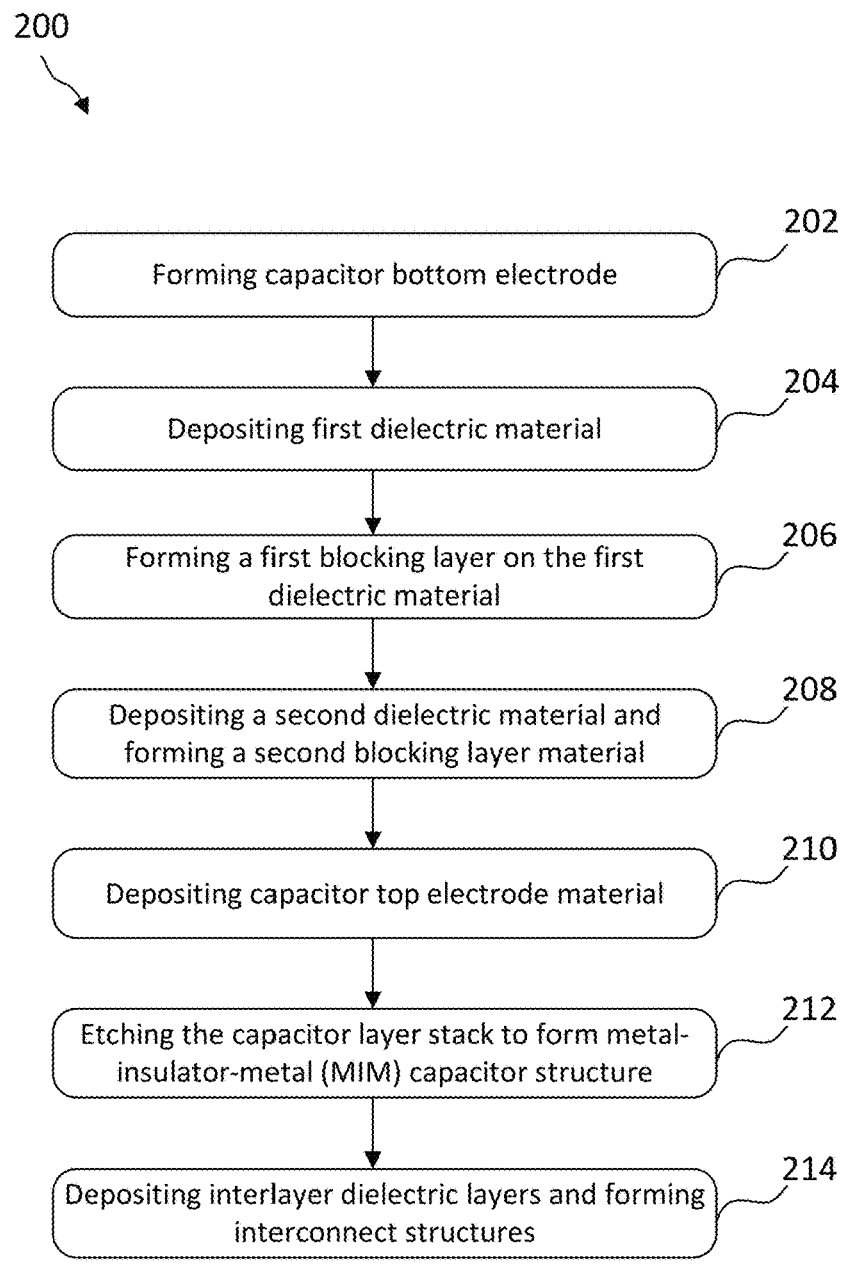
FIG. 2
Amended

METAL-INSULATOR-METAL CAPACITORS WITH HIGH BREAKDOWN VOLTAGE

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIG. 2 is a flow diagram of a method for forming a MIM capacitor, in accordance to some embodiments.

DETAILED DESCRIPTION

Figure 1:
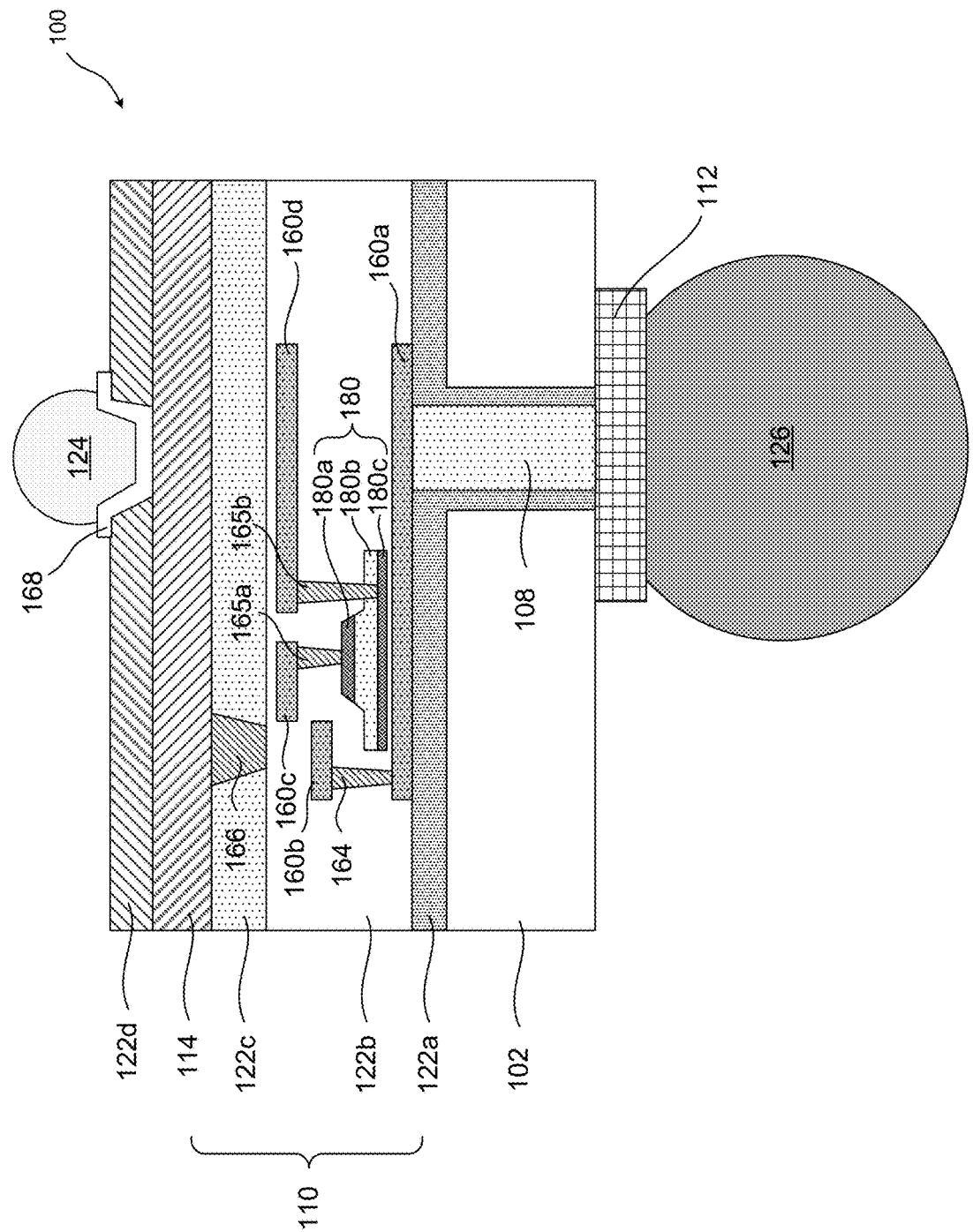
FIG. 1 is a cross-sectional view of a semiconductor device 100 incorporating MIM capacitor with high breakdown voltage, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within, for example, 5% of the value (e.g., ±1%, ±2%, ±3%, ±4%, ±5% of the value).

The terms "vertical direction" and "horizontal direction" respectively refer to z-direction and x-direction as illustrated in the figures herein.

Capacitors are elements that are used in semiconductor devices for storing electrical charges. Capacitors are used in, for example, filters, analog-to-digital converters, memory devices, control applications, and many other types of semiconductor devices. One type of capacitor is a metal-insulator-metal (MIM) capacitor. The MIM capacitor can be formed with two conductive plates in parallel and a dielectric layer sandwiched in between. The MIM capacitor can be used as a decoupling capacitor that are built into chips to prevent voltage spikes in a power supply, such as when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Spike suppression performance can improve with decoupling capacitors that feature higher capacitance. In a chip fabrication process, decoupling capacitors can be integrated in the far back end of the line during or after packaging of the chip. Decoupling capacitors can be integrated into a three-dimensional ("3D") IC packaging, such as a chip-on-wafer-on-substrate (CoWoS) chip package or an integrated fan-out (InFO) chip package. Decoupling capacitors formed as part of an interposer of a CoWoS and an InFO chip package can have a MIM structure that includes a high dielectric constant (high-k) insulator (e.g., dielectric constant higher than 3.9). MIM capacitors can also be used in radio-frequency devices or devices incorporating mixed signals.

IC packaging has evolved such that multiple ICs can be vertically stacked in the 3D packages in order to save horizontal area on a printed circuit board ("PCB"). An alternative packaging technique, referred to as a "2.5D package," can use an interposer structure, which may be formed from a semiconductor material, such as silicon, for coupling one or more semiconductor dies to a PCB. ICs or other semiconductor dies, which may incorporate heterogeneous technologies, can be mounted on the interposer. In addition to being joined to the IC dies, the interposer can also be joined to the PCB and to a package substrate disposed between the PCB and the interposer.

However, MIM capacitors can be prone to current leakage and electrical breakdown. For example, as the voltage applied across the capacitor exceeds a certain voltage threshold, the electric field between the two capacitor electrodes exceeds its electrical field strength limit and the dielectric layer between the capacitor electrodes becomes conductive. This certain voltage threshold is referred to as "capacitor breakdown voltage." Capacitors with high breakdown voltages can improve device performance and used in high-voltage and high-performance devices. However, capacitor breakdown can be caused by a number of factors, such as direct punch through of the capacitor dielectric layer due to pin holes in the dielectric layer. Another breakdown mechanism is current leakage paths that causes the capacitor to become conductive when voltage is applied. In a MIM capacitor for example, current leakage path can be formed on sidewalk of the capacitor dielectric layer when conductive ions remain at the dielectric layer interface during the etching process of capacitor electrode. Current leakage paths can cause the breakdown voltage of MIM capacitors to be, for example, below about 20 V. Therefore, current leakage paths in MIM capacitors present challenges for high-voltage and high-performance devices.

Various embodiments in accordance with this disclosure provide mechanisms of forming a metal-insulator-metal (MIM) capacitor structure having high breakdown voltages (e.g., above about 25 V). According to the present disclosure, the MIM capacitor can have one or more blocking layers embedded in the capacitor dielectric layers configured to prevent current leakage paths from causing capacitor breakdowns. Specifically, blocking layers can be one or more oxygen-rich nitride layers (e.g., having at least about 5% of oxygen atomic concentration) that are embedded between capacitor dielectric layers. In some embodiments, a blocking layer can be formed on a first capacitor dielectric layer and under a second capacitor dielectric layer. A thickness of the first dielectric layer can be less than a thickness of the second dielectric layer such that the blocking layer remains without exposed under the second dielectric layer after the over-etching process of the capacitor top electrode. Without modifying the etching process of the capacitor top electrode, the one or more blocking layers prevent current leakage paths formed by conductive ions embedded at the interface of capacitor dielectric during over-etching of the capacitor top electrode.

FIG. 1 illustrates a cross-sectional view of an interposer structure 100 incorporating a MINI capacitor structure having high breakdown voltage (e.g., greater than about 25 V), in accordance with embodiments of the present disclosure. The interposer structure illustrated in FIG. 1 is an example of a semiconductor device incorporating MIM capacitors, and the MIM capacitors described in the present disclosure can also be used in any other suitable semiconductor devices such as three-dimensional integrated circuits. In some embodiments, the MIM capacitors can be used in radio-frequency devices and mixed signal devices.

Interposer structure 100 includes a substrate 102, and a contact pad 112 disposed on substrate 102. A through-silicon via (TSV) 108 formed in substrate 102 is electrically coupled to contact pad 112. Though one contact pad 112 is shown in FIG. 1, in accordance with embodiments of the present disclosure, more than one contact pad 112 can be formed over a surface of substrate 102. For example, there may be dozens or hundreds of contact pads 112 and TSVs 108 formed on the surface of substrate 102, depending on the application and size of an integrated circuit die.

Substrate 102 can be a silicon substrate, according to some embodiments. In some embodiments, substrate 102 can be (i) another semiconductor, such as germanium; (ii) a compound semiconductor; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material. Alternatively, substrate 102 can be formed of a dielectric material. In some embodiments, substrate 102 can be substantially free from integrated circuit devices, including active devices, such as transistors and diodes. In some embodiments, substrate 102 can include, or can be free from, passive devices, such as capacitors, resistors, inductors, and/or the like.

Contact pad 112 can be formed on a surface of substrate 102 using subtractive etching, direct etching, damascene lithography techniques, and/or any other suitable technique. Contact pad 112 can be formed of a metal adapted to be coupled to a bump 126. Bump 126 is formed on and electrically connected to contact pad 112. Bump 126 can include solder bumps, such as eutectic solder bumps. Alternatively, bump 126 can be formed of copper bumps or other metal bumps formed of gold, silver, nickel, tungsten, aluminum, other metals, and/or alloys thereof. Bump 126 can also include Controlled Collapse Chip Connection (C4) bumps used in semiconductor interconnection techniques, such as flip chip interconnections. In some embodiments, bump 126 can protrude from the surface of substrate 102, as shown in FIG. 1. A solder mask (not shown) can be formed before the formation of the bump 126 to protect the bump material from forming in undesired regions.

TSV 108 is formed on substrate 102 by extending through substrate 102, as shown in FIG. 1. TSV 108 is formed of conductive materials such as a metal, a semiconductor material such as silicon, or combinations or multiple layers thereof, for example.

An interconnect structure 110 is formed over substrate 102 and includes one or more insulating material layers 122a, 122b, 122c, conductive lines 160a, 160b, and 160c, via 164 formed in insulating material layer 122b, and MIM capacitor 180 formed between conductive lines 160a and 160b. For simplicity, other insulating material layers, conductive lines, vias, and/or capacitor structures are not illustrated in FIG. 1. The various layers of interconnect structure 110 can be formed using etching, direct etching, damascene lithography techniques, any suitable technique, or combinations thereof.

Insulating material layers 122a, 122b, and 122c can be intermetallic dielectric layers used to provide electrical insulation between interconnect conductive lines in interposer structure 100. Insulating material layers 122a, 122b, 122c can be formed of dielectric materials, such as silicon oxide, undoped silica glass, fluorinated silica glass, other suitable materials, or combinations thereof. In some embodiments, insulating material layers 122a, 122b, and 122c are formed using a low-k dielectric material (e.g., material with a dielectric constant less than 3.9). In some embodiments, insulating material layer 122b can include two or more insulating material layers, which are not shown in FIG. 1 for simplicity. For example, each conductive line can be formed in a dielectric layer within insulating material layer 122b. In some embodiments, insulating material layer 122d can be a patterned passivation layer.

Interconnect structure 110 includes one or more conductive lines that are electrically coupled to each other or other devices through vias formed in insulating material layers. For example, conductive lines 160a, 160b, 160c, and 160d are formed in insulating material layer 122*b* and in metallization layers of interconnect structure 110. In some embodiments, conductive line 160*a* can be formed in a first metallization layer (e.g., M1 layer of a back-end-of-line ("BEOL") structure), conductive lines 160*b* and 160*c* can he formed in a second metallization layer (e.g., M2 layer of the BEOL structure). Alternatively, conductive lines 160*a*, 160*b*, 160*c*, and 160*d* can be formed in other metallization layers of interposer structure 100. Vias 164, 165*a*, 165*b*, and 166 are formed within insulating material layers and are electrically coupled to conductive layers. For example, via 164 is electrically coupled to conductive lines 160*a* and 160*b*. Vias 165*a* and 165*b* can be electrically coupled to conductive lines 160*c* and 160*d* respectively, and both to MIM capacitor 180 as further described below. In some embodiments, the vias can be formed using aluminum, silver, copper, cobalt, any suitable metals, or combinations thereof. In some embodiments, interposer structure 100 can further include other conductive lines or vias and are not illustrated in FIG. 1 for simplicity. In some embodiments, there may be dozens or hundreds of contact vias and conductive lines formed within insulating material layer 122*b*, depending on the application and size of an integrated circuit die.

MIM capacitor 180 can be placed in insulating material layer 122*b* as a decoupling capacitor for devices or for power/ground lines embedded in insulating material layer 122*b*. MIM capacitor 180 can include a capacitor top electrode 180*a*, a dielectric structure 180*b*, and a capacitor bottom electrode 180*c*. MIM capacitor 180 is a parallel plate capacitor incorporating blocking layers in its capacitor dielectric and has a high breakdown voltage (e.g., greater than about 20 V). For example, dielectric structure 180*b* includes one or more blocking layers that can prevent leakage current. The detailed structure of MIM capacitor 180 is not illustrated in detail in FIG. 1 but is described in detail in FIG. 9. To serve as decoupling capacitor for power/ground lines or other conductive lines within interposer structure 100, MIM capacitor 180 can be coupled to conductive structures using through vias. For example, vias 165*a* and 165*b* are respectively connected to top and bottom electrodes 180*a* and 180*c*. In some embodiments, MIM capacitors can be formed between other metallization layers, such as M3, M4, M5, etc.

A redistribution layer (RDL) 114 can be formed on insulating material layer 122*c*. RDL 114 can include fan-out regions (not shown) for fanning-out the exterior connections of an integrated circuit die to a larger footprint on substrate 102. In some embodiments, RDL 114 can be formed using any suitable material, such as aluminum, aluminum alloy, or other metals. In some embodiments, RDL 114 can further include fuses.

An optional under-ball metallization (UBM) structure 168 can be formed in insulating material layer 122*d* and on RDL 114. UBM 168 can include conductive lines containing metal material to facilitate the formation of bump 124.

Bump 124 can be formed in a peripheral region of interposer structure 100 and can include micro-bumps, according to some embodiments. Each bump 124 can include an optional metal stud (not shown) that can be formed using copper, a copper alloy, or other metals. Bump 124 can alternatively comprise other materials. The metal studs of bump 124 can be formed of any suitable conductive material, such as copper, nickel, platinum, aluminum, or combinations thereof. The metal stud and bump 124 can be formed through any number of suitable techniques, including physical vapor deposition (PVD), chemical vapor deposition (CVD), electrochemical deposition (ECD), molecular beam epitaxy (MBE), atomic layer deposition (ALD), electroplating, and the like. An optional conductive cap layer can be formed between the metal stud and the solder of the bump 124, also not shown for simplicity. For example, in an embodiment in which the metal stud is formed of copper, a conductive cap layer formed of nickel may be formed. Other materials, such as platinum, gold, silver, combinations thereof, or the like, may also be used for the optional conductive cap layer of bump 124.

FIG. 2 is a flow diagram of an exemplary method 200 for forming MIM capacitors having one or more blocking layers, in accordance with some embodiments of the present disclosure. The capacitor dielectric layer of the MIM capacitors can include one or more blocking layers embedded between dielectric layers. In some embodiments, the dielectric layers can be formed using silicon nitride. In some embodiments, the one or more blocking layers can be formed by performing a oxygen treatment process on the silicon nitride dielectric layer.

It should be noted that the operations of method 200 can be performed in a different order and/or vary, and method 200 may include more operations and are not described for simplicity. FIGS. 3-9 are cross-sectional views of fabricating an exemplary semiconductor structure 300 incorporating MIM capacitors having high breakdown voltages. Semiconductor structure 300 can be formed on a substrate or other suitable layers, such as metal or dielectric layers. FIGS. 3-9 are provided as exemplary cross-sectional views to facilitate in the explanation of method 200. Although the fabrication process of forming MIM capacitors on a substrate is described here as an example, the fabrication process can be applied on various layers, such as on interlayer dielectrics, insulation layers, conductive layers, and any other suitable layers. The fabrication processes provided here are exemplary, and alternative processes in accordance with this disclosure may be performed that are not shown in these figures.

Figure 3:
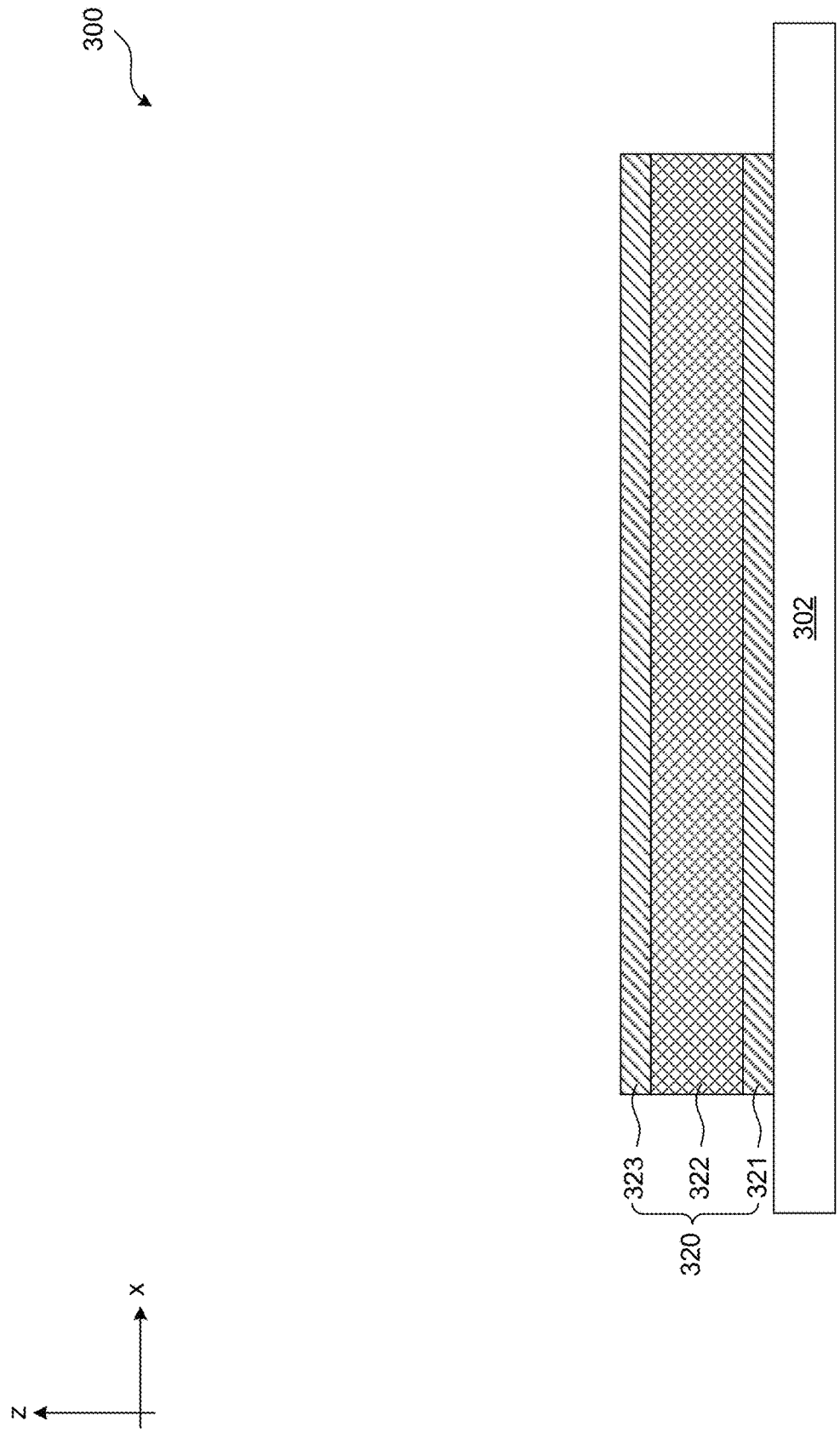
FIGS. 3-9 are cross-sectional views of semiconductor structures, in accordance with some embodiments.

At operation 202, capacitor bottom electrode is formed, in accordance with some embodiments of the present disclosure. Referring to FIG. 3, semiconductor structure 300 includes a substrate 302 and a capacitor bottom electrode 320.

Substrate 302 can be a silicon substrate, according to some embodiments. In some embodiments, substrate 302 can be (i) another semiconductor, such as germanium; (ii) a compound semiconductor; (iii) an alloy semiconductor including silicon germanium (SiGe); or (iv) combinations thereof. In some embodiments, substrate 302 can be a semiconductor on insulator (SOI). In some embodiments, substrate 302 can be an epitaxial material. In some embodiments, substrate 302 can be any suitable layers such as dielectric layers, metal layers, and any other suitable layers. Substrate 302 can also include any suitable device. For example, circuitry including active and passive devices can be formed in substrate 302. In some embodiments, devices of a front-end-of-line (FECAL) portion of the integrated circuit fabrication can be formed in substrate 302. In some embodiments, devices such as transistors, capacitors, interconnects, and any suitable device can be formed in substrate 302.

Capacitor bottom electrode 320 is disposed on substrate 302. In some embodiments, capacitor bottom electrode 320 can include sublayers. For example, capacitor bottom electrode 320 can include a first sublayer 321, a second sublayer 322, and a third sublayer 323. First sublayer 321 is formed over substrate 302 and can be made of tantalum nitride (TaN). In some embodiments, first sublayer 321 can be formed of aluminum copper alloy (AlCu), aluminum, copper, other suitable materials, or combinations thereof. The deposition of first sublayer 321 can be done by, for example, physical vapor deposition (PVD). In some embodiments, any suitable processes can be used to form first sublayer 321, such as atomic layer deposition (ALD), molecular beam epitaxy (MBE), high density plasma CVD (HDPCVD), metal organic CVD (MOCVD), remote plasma CVD (RPCVD), plasma-enhanced CND (PECVD), plating, other suitable methods, or combinations thereof. The deposition process can be performed in a deposition chamber, such as a PVD chamber, at a pressure below about 20 mTorr and at a temperature of about 100° C. The power level used in the deposition process can be in a range from about 1000 W to about 6000 W. In some embodiments, the thickness of first sublayer 321 can be in a range from about 100 Å to about 300 Å (e.g., 100 Å to 300 Å). For example, first sublayer 321 can be a TaN layer that has a thickness of about 200 Å.

Second sublayer 322 is formed over first sublayer 321 and can be made of aluminum copper alloy (AlCu). In some embodiments, second sublayer 322 can be formed using suitable materials similar to or different from first sublayer 321. For example, second sublayer 322 can be formed of TaN, aluminum, copper, other suitable materials, or combinations thereof. The deposition of second sublayer 322 can be done by a deposition process similar to the deposition process for first sublayer 32,1 such as a PVD process. In some embodiments, the deposition can be a different deposition process. For example, the deposition process of second sublayer 322 can be performed in a PVD chamber at a temperature of about 170° C. and a power level in a range from about 500 W to about 20,000 W. In some embodiments, the thickness of second sublayer 32.2 can be in a range from about 1100 Å to about 1300 Å (e.g., 1100 Å to 1300 Å). For example, second sublayer 322 can be an AlCu layer that has a thickness of about 1200 Å.

Third sublayer 323 is formed over second sublayer 322 and can be made of TaN. In some embodiments, third sublayer 323 can be formed using suitable materials similar to or different than first sublayer 321. For example, third sublayer 323 can be formed of AlCu, aluminum, copper, other suitable materials, or combinations thereof. The deposition of third sublayer 323 can be done by a deposition process similar to the deposition process for first sublayer 321, such as a PVD process. In some embodiments, the deposition can be a different deposition process. For example, the deposition process of third sublayer 323 can be performed in a PVD chamber at a temperature of about 100° C. and a power level in a range from about 1000 W to about 6000 W. In some embodiments, the thickness of third sublayer 323 can be in a range from about 500 Å to about 700 Å (e.g., 500 Å to 700 Å). For example, third sublayer 323 can be a TaN layer that has a thickness of about 600 Å.

Figure 4:
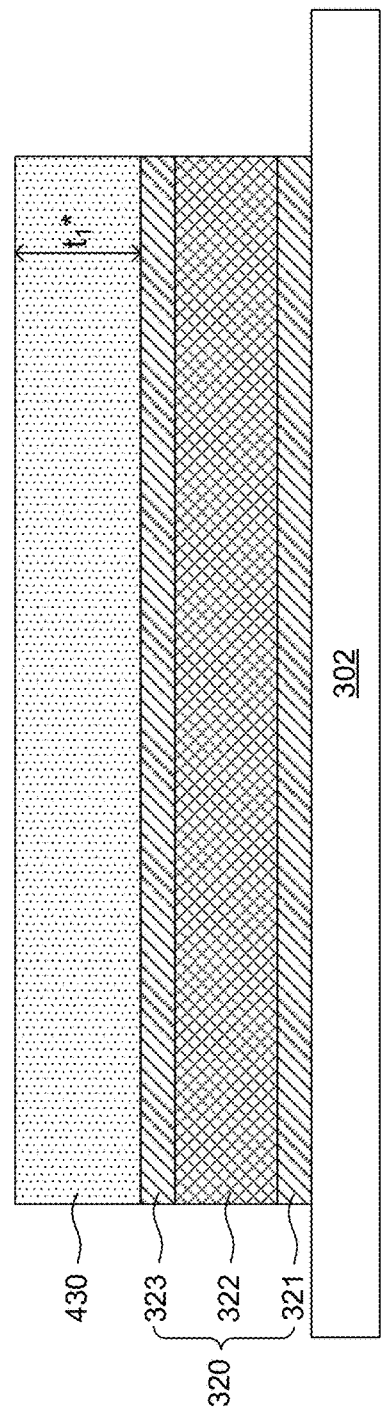

Referring to FIG. 2, at operation 204, a first dielectric material is deposited, according to some embodiments of the present disclosure. Referring to FIG. 4, a first dielectric material 430 is formed on the top surface of capacitor bottom electrode 320. First dielectric material 430 can be made of a high-k dielectric material. In some embodiments, first dielectric material 430 can be formed of any suitable dielectric material, such as silicon nitride ($SiN_x$). Other suitable dielectric materials can be used, such as silicon oxide ($SiO_x$), hafnium oxide ($HfO_2$), silicon oxynitride, other suitable dielectric material, or combinations thereof. In some embodiments, first dielectric material 430 can include one or more layers. First dielectric material 430 is used to form a portion of capacitor dielectric and its thickness can be selected based on a desired capacitance. In some embodiments, the thickness $t^*$ of first dielectric material 430 can be in a range from about 100 Å to about 500 Å. In some embodiments, thickness $t_1^*$ can be between about 180 Å and about 220 Å, between about 220 Å and about 300 Å, between about 300 Å and about 500 Å, or any suitable thickness. For example, first dielectric material 430 can be a silicon nitride layer with a thickness $t_1^*$ of about 100 Å. In some embodiments, $t_1^*$ can be about 120 Å. First dielectric material 430 can be deposited using any suitable process, such as PVD, ALD, MBE, HDPCVD, MOCVD, RPCVD, PECVD, plating, other suitable methods, or combinations thereof.

Figure 5:
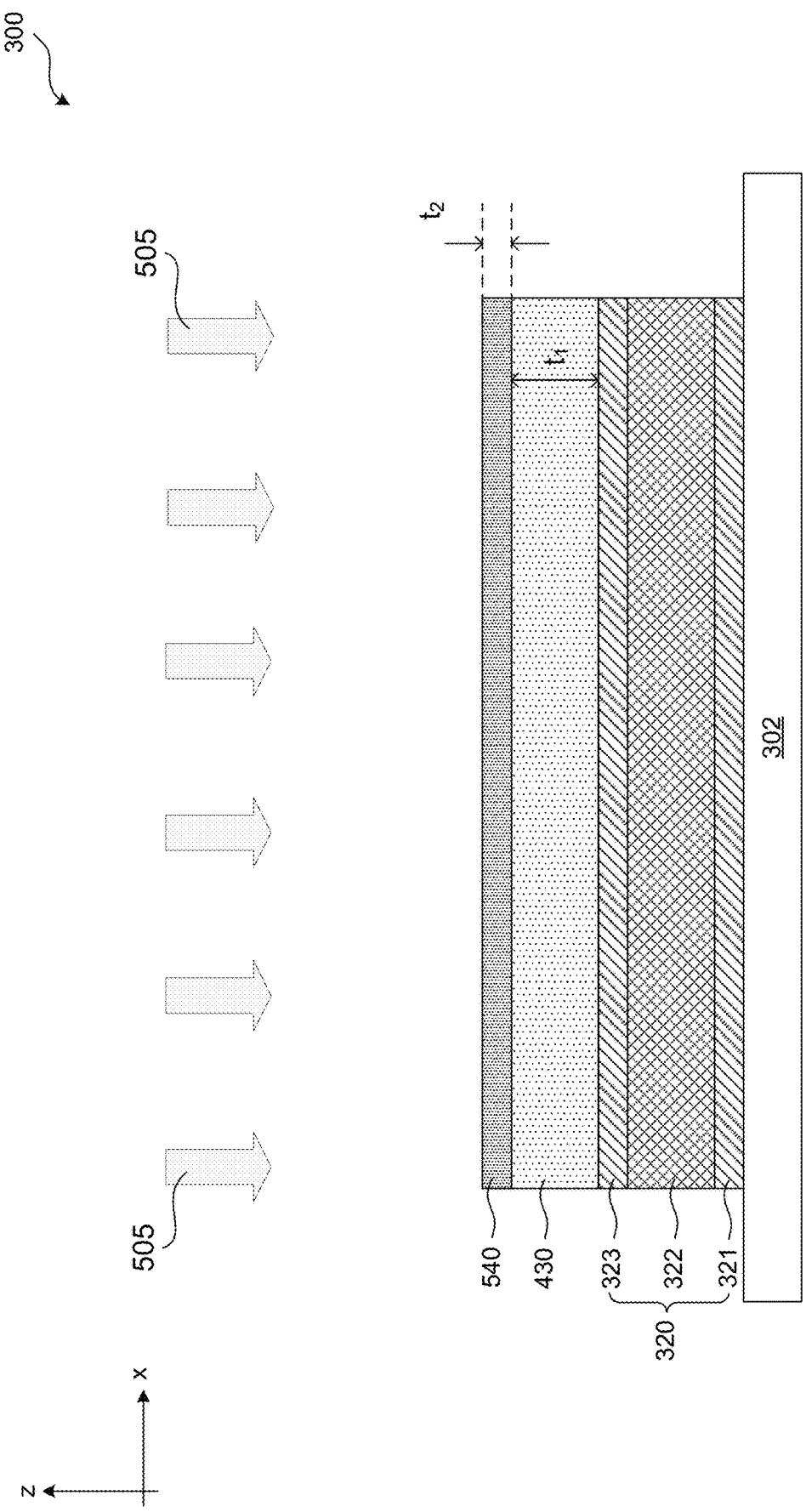

Referring to FIG. 2, at operation 206, a first blocking layer is formed on the first dielectric material, according to some embodiments of the present disclosure. Referring to FIG. 5, a first blocking layer 540 is formed on first dielectric material 430. First blocking layer 540 can be formed by performing a treatment process 505 on exposed first dielectric material to convert a portion of first dielectric material 430 into first blocking layer 540. In some embodiments, first dielectric material 430 is formed of silicon nitride and the treatment process 505 can convert a portion of first dielectric material 430 into an oxygen-rich silicon nitride material. In some embodiments, the treatment process can be performed in a chamber, such as a plasma chamber, at a chamber pressure between about 2.2 Ton and about 6.2 Torr. In some embodiments, treatment process 505 can use oxygen-containing precursors, such as oxygen, nitrous oxide ($N_2O$), any suitable precursors, or combinations of the same. In some embodiments, noble gas precursors, such as argon, can be mixed with the oxygen-containing precursors during treatment process 505. In some embodiments, the power level used in the deposition process can be in a range from about 150 W to about 450 W.

Treatment process 505 can form first blocking layer 540 on first dielectric material 430. The oxygen atomic concentration of first blocking layer 540 can be about 2% to about 6% greater than first dielectric material 430. For example, the oxygen atomic concentration can be about 5% greater. In some embodiments, oxygen atomic concentration can be greater at a top surface of first blocking layer 540 and gradually decrease as the depth increases, until the oxygen atomic concentration can be almost zero at the interface of first blocking layer 540 and first dielectric material 430. In some embodiments, the average oxygen atomic concentration of first blocking layer 540 can be about 5%, about 5.5%, 6%, or about 7% greater than the atomic concentration of first dielectric material 430. In some embodiments, a greater oxygen atomic concentration can provide improved leakage current blocking capability. As blocking layer 540 can convert a portion of first dielectric material 430, the remaining thickness $t_1$ of first dielectric material 430 can be less than thickness $t_1^*$ that is prior to treatment process 505. In some embodiments, remaining thickness $t_1$ can be between about 80 Å and about 120 Å. For example, remaining thickness $t_1$ can be about 100 Å. First blocking layer 540 can have a thickness $t_2$ between about 2 Å and about 100 Å. In some embodiments, a greater thickness $t_2$ of first blocking layer 540 can provide higher breakdown voltage and lower leakage of the metal-insulator-metal capacitor. In some embodiments, a lower thickness $t_2$ can provide greater electrostatic discharge (ESD) capability.

In some embodiments, first blocking layer 540 can be formed by directly depositing first blocking material on first dielectric material 430. For example, first blocking layer 540 can be formed by directly depositing a silicon oxynitride material on first dielectric material 430 using any suitable deposition process, such as PVD, ALD, MBE, HDPCVD, MOCVD, RPCVD, PECVD, or combinations thereof.

Figure 6:
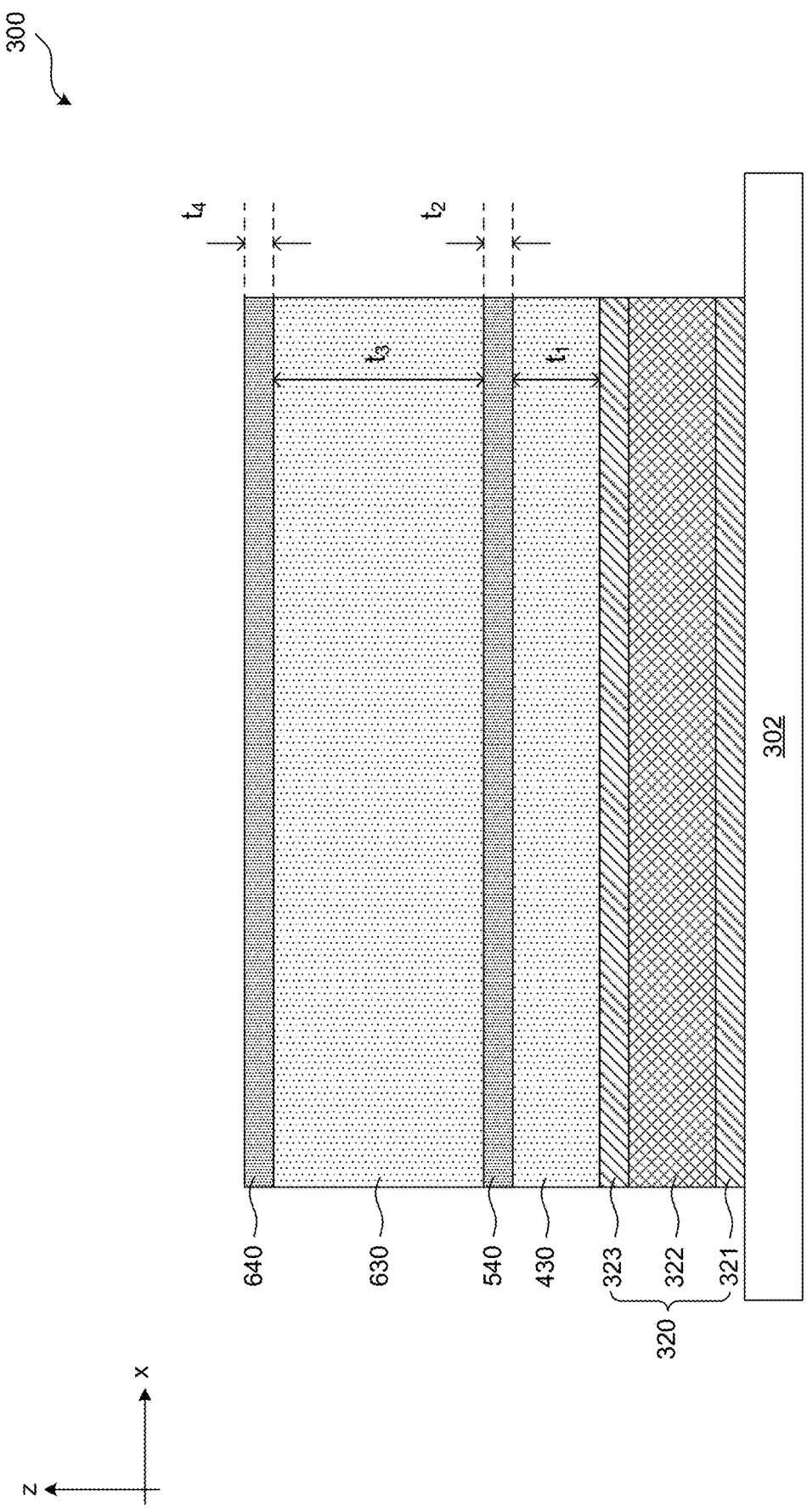

Referring to FIG. 2, at operation 208, a second dielectric material is deposited and a second blocking layer material is formed, in accordance with some embodiments of the present disclosure. Referring to FIG. 6, a second dielectric material 630 and a second blocking layer material 640 are formed on first blocking layer 540. In some embodiments, the compositions and formations of second dielectric material 630 and second blocking layer material 640 can be respectively similar to those of first dielectric material 430 and first blocking layer 540. For example, second dielectric material 630 can be formed of silicon nitride, and second blocking layer material 640 can be an oxygen-rich silicon nitride layer. In some embodiments, second dielectric material 630 can have a thickness $t_3$ that is between about 150 Å and about 600 Å. For example, thickness h of second dielectric material 630 can be about 150 Å, 200 Å, 300 Å, 500 Å, 600 Å, or any other suitable thickness. In some embodiments, thickness $t_3$ can be greater than thickness $t_1$. For example, a thickness ratio R of thickness $t_3$ to thickness $t_1$ can be between about 2 and about 3. A greater thickness ratio R provides greater tolerance of the over-etching process of capacitor top electrode without exposing first blocking layer 540, as further described below with reference to operation 214. Thickness $t_4$ of second blocking layer material 640 can be between about 2 Å and about 100 Å. In some embodiments, a greater thickness $t_4$ of second blocking layer 640 can provide higher breakdown voltage and lower leakage of the metal-insulator-metal capacitor. In some embodiments, a lower thickness can provide greater electrostatic discharge (ESD) capability. Second blocking layer material 640 can be formed using methods and material similar to those of first blocking layer 540. For example, second blocking layer material 640 can be formed by performing a treatment process similar to treatment process 505 on second dielectric material 630 and convert a portion of second dielectric material 630 into an oxygen-rich layer.

Figure 7:
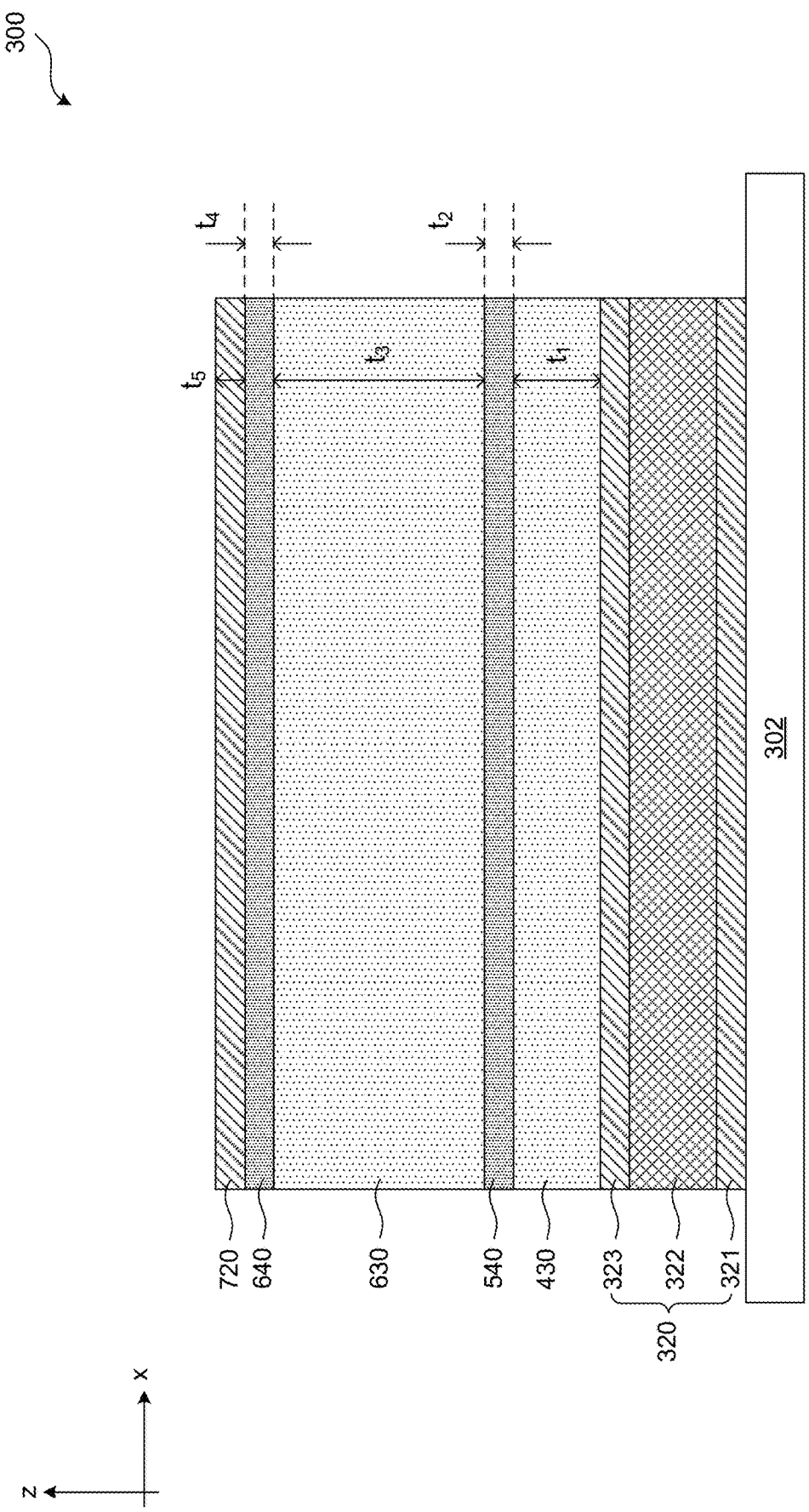

Referring to FIG. 2, at operation 210, capacitor top electrode material is deposited, in accordance with some embodiments of the present disclosure. Referring to FIG. 7, capacitor top electrode material 720 is deposited on second blocking layer material 640. In some embodiments, capacitor top electrode material 720 can be formed using the same conductive material as capacitor bottom electrode material 320. For example, capacitor top electrode material 720 can be formed using tantalum nitride. In some embodiments, capacitor top electrode material 720 can be formed using aluminum copper alloy. In some embodiments, thickness $t_5$ of capacitor top electrode material 720 can be between about 600 Å and about 1000 Å. For example, thickness $t_5$ can be between about 600 Å and about 700 Å, between about 700 Å and about 800 Å, between about 800 Å and about 1000 Å. In some embodiments, thickness $t_5$ is about 800 Å.

Figure 8:
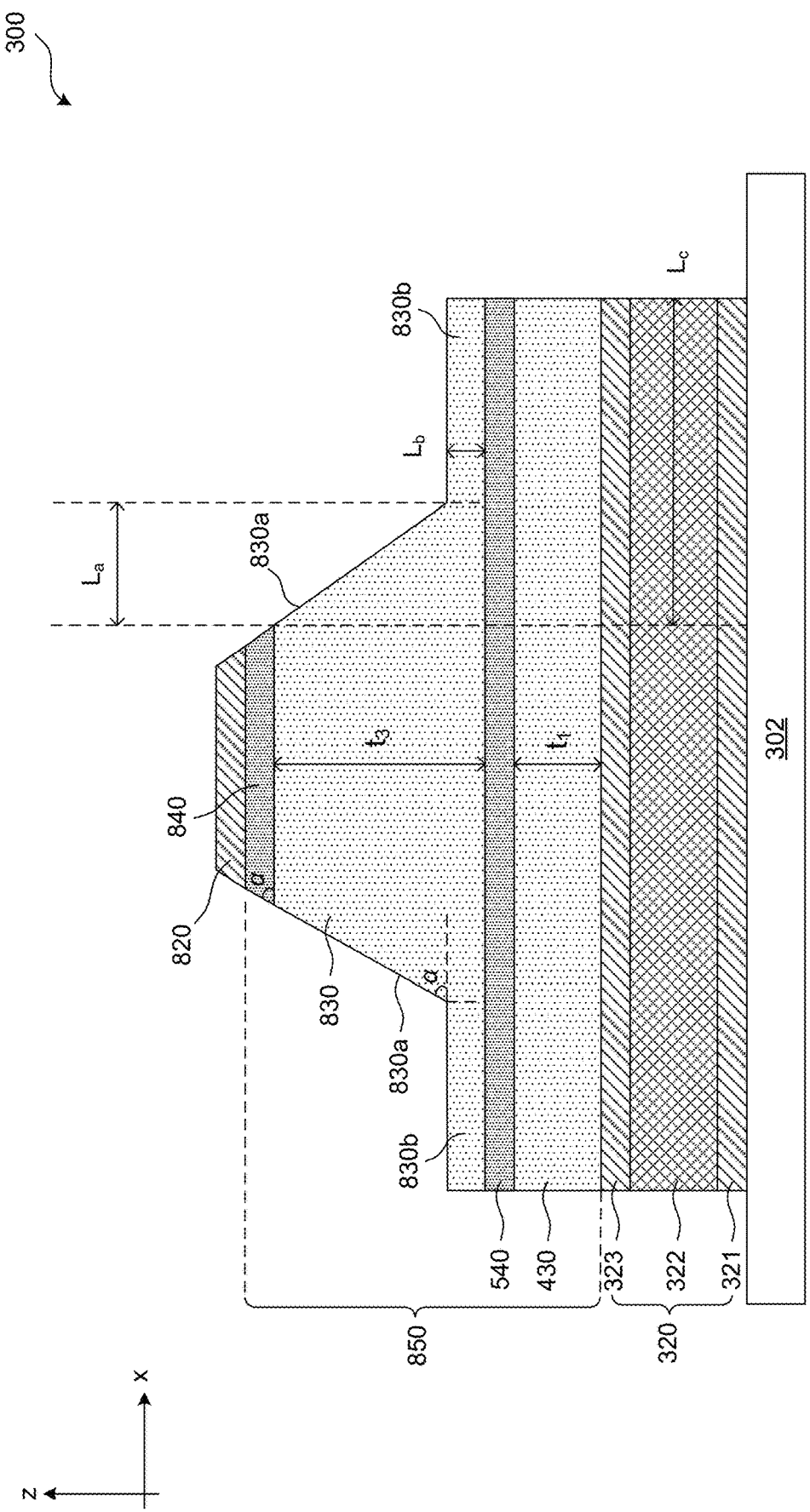

Referring to FIG. 2, at operation 212, the capacitor layer stack is etched to form a MIM capacitor structure, in accordance to some embodiments of the present disclosure. Referring to FIG. 8, the capacitor layer stack is etched to form capacitor top electrode 820, second blocking layer 840, and second dielectric layer 830. A patterning and etching process is used to define the boundaries of capacitor top electrode 820. The patterning process can include forming a masking layer over capacitor top electrode material 720, exposing the resist to a pattern, performing post-exposure bake processes, and developing the resist to form a masking element consisting of the photoresist. The masking element can then be used to protect regions of capacitor top electrode material 720 while the etching process removes exposed regions of capacitor top electrode material 720. In some embodiments, the same etching process that is used to etch capacitor top electrode material 720 continues to remove portions of underlying second blocking material 640 and portions of second dielectric material 630. This etching process can be referred to as an over-etching process. The etching process stops before first blocking layer 540 is exposed.

In some embodiments, the MIM capacitor can have sidewalls that are not perpendicular to the horizontal substrate surface or the top surfaces of conductive and dielectric layers, as viewed in the cross-sectional view of FIG. 8. For example, a sidewall 830*a* of second dielectric layer 830 can be at a non-perpendicular angle with reference to top surfaces of portions 830*b*. Second dielectric layer 830 can be etched by a plasma etching process, where one or more processing parameters such as process timing, chamber pressure, gas mixtures, processing temperatures, radio frequency (RF) power levels, and/or other suitable processing parameters, can be adjusted to achieve a nominal sidewall slope profile. As shown in FIG. 8, slope angle α between the sidewalls and the horizontal direction (e.g., x direction or top surfaces of portions 830*b*) can be in a range from about 70° to about 89° and achieved by adjusting one or more processing parameters of the removal processes. In some embodiments, second blocking layer 840 can also have a sloped sidewall profile that has a similar slope angle α. The over-etching process stops before first blocking layer 540 is exposed, and second dielectric layer 830 can have portions 830*b* that extend in the horizontal direction (e.g., x direction) and also protects underlying first blocking layer 540. In some embodiments, portions 830*b* can be substantially planar and abut sidewalls 830*a*. In some embodiments, length $L_a$ measured between the edge of capacitor top electrode 820 and edge of sloped sidewall 830*a* of second dielectric layer 830 can be greater than about 20 Å. For example, length $L_a$ can be between about 20 Å and about 50 Å, about 50 Å and about 100 Å, about 100 Å and about 1000 Å, about 1000 Å and about 2000 Å, or any suitable ranges based on device dimensions and nominal capacitance. In some embodiments, a ratio $R_1$ of length $L_a$ to thickness $t_3$ can be between about 0 and about 5. For example, ratio $R_1$ can be between about 1 and about 3. In some embodiments, a greater value of ratio $R_1$ can prevent voids and defects between second dielectric layer 830 and a subsequently formed interlayer dielectric layer. Thickness $L_b$ of portions 830*b* can be greater than 10 Å. For example, thickness $L_b$ can be between about 10 Å and about 30 Å, about 30 Å and about 100 Å, about 100 Å and about 200 Å, about 200 Å and about 500 Å, or any other suitable range. Thickness $L_b$ can depend upon the progress and need of the over-etching process of capacitor top electrode 820. For example, a lower thickness $L_b$ can ensure that exposed portions of capacitor top electrode material 720 is completely removed to form capacitor top electrode 820 for different MIM capacitors across the wafer. In some embodiments, a ratio $R_2$ of length $L_b$ to thickness $t_3$ can be between about 0 and about 1. For example, ratio $R_2$ can be between about 0.2 and about 0.8. In some embodiments, a greater value of ratio $R_2$ can provide greater breakdown voltage and lower leakage of the metal-insulator-metal capacitor structure. In some embodiments, $L_b$ is greater than 10 Å when $L_a$ is greater than 20 Å. In some embodiments, $L_b$ is greater than 10 Å when $L_a$ is greater than 1000 Å. Horizontal length $L_c$ measured from the edge of capacitor top electrode 820 to the edge of capacitor bottom electrode 320 can be greater than about 1000 Å. For example, length $L_c$ can be between about 1000 Å and about 1500 Å, about 1500 Å and about 2000 Å, about 2000 Å and about 3000 Å, about 3000 Å and about 5000 Å, or any other suitable range based on device dimensions and nominal capacitance. In some embodiments, a ratio $R_3$ of length $L_c$ to thickness $t_3$ can be greater than about 1. For example, ratio $R_3$ can be between about 1 and about 10.

Capacitor dielectric 850 including first dielectric material 430, first blocking layer 540, second dielectric layer 830, and second blocking layer 840 can provide greater current leakage path blocking capabilities than other capacitor structures. During the over-etching process that defines capacitor top electrode 820, ions of the etchant precursor and removed conductive material from capacitor top electrode material 720 can remain on exposed surfaces of second dielectric layer 830, such as sloped sidewall 830a and top surfaces of portions 830b. These conductive ions and conductive material on the exposed surfaces can form current leakage paths and be viewed as virtual extensions of capacitor top electrode 820. Without first blocking layer 540, the current leakage paths can penetrate first dielectric material 430 and cause capacitor breakdown. First blocking layer 540 containing oxygen-rich nitride material can serve as an electric field blocking layer that prevents excessive electric field build up in portions of second dielectric layer 830, for example, in portions 830b. In addition, a greater thickness ratio R of thickness $t_3$ to thickness $t_1$ can provide that first blocking layer 540 is still protected and covered by portions 830b after the over-etching process that forms capacitor top electrode 820, and can be done so without modifying the etching process for forming capacitor top electrode 820. As such, thickness ratio R can be about 1.5, about 2, about 2.5, about 3, or any other suitable ratio. In some embodiments, thickness ratio R can be between about 1.5 and about 3. Thickness ratio R can depend on the over-etching process. For example, a greater ratio R can be compatible with an over-etching process that results in a greater etching depth without exposing and potentially removing first blocking layer 540.

Figure 9:
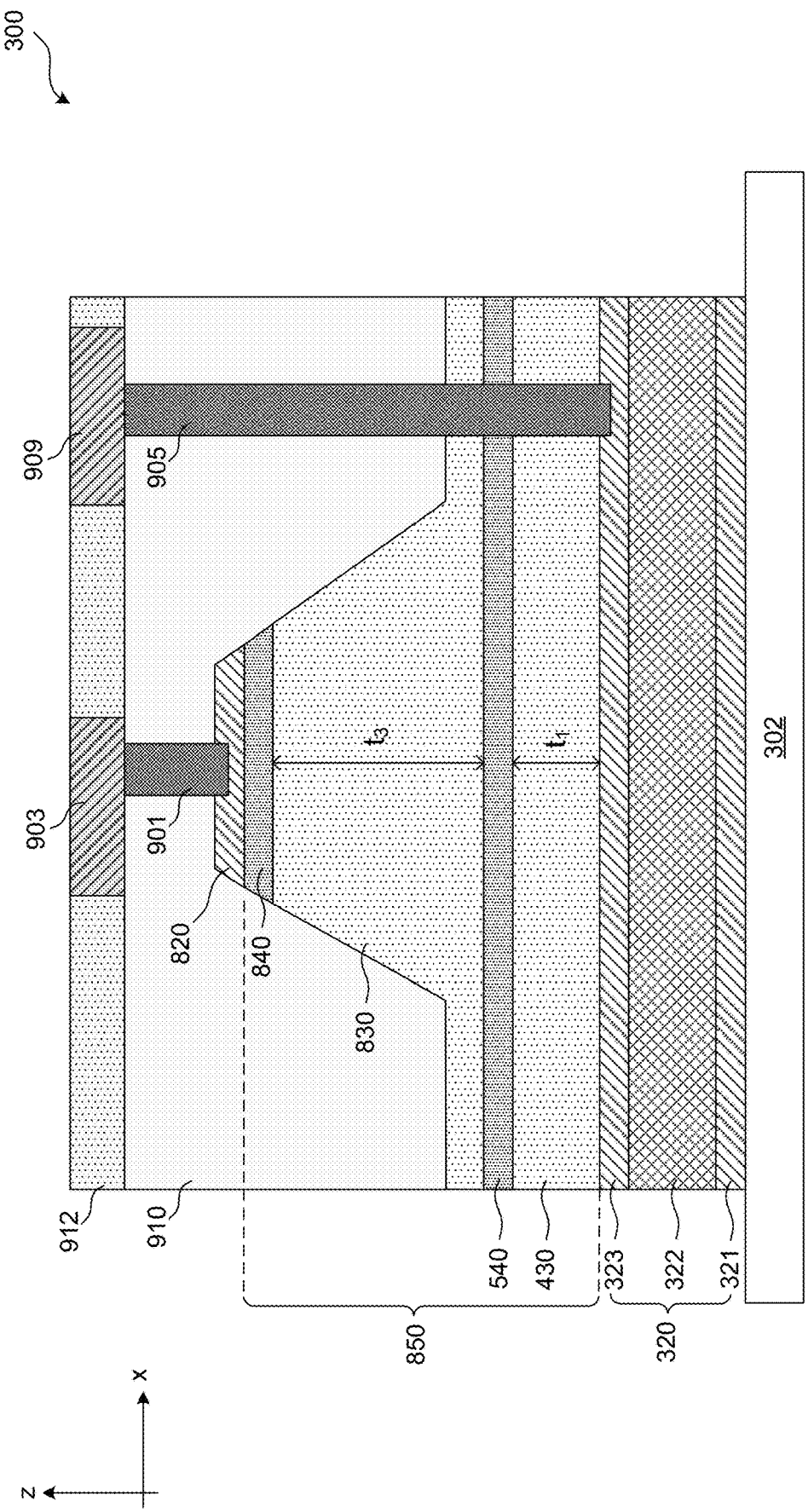

Referring to FIG. 2, at operation 214, interlayer dielectric layers and interconnect structures are formed, in accordance to some embodiments of the present disclosure. Referring to FIG. 9, first contact 901, first interconnect 903, second contact 905, second interconnect 909 are formed in interlayer dielectric layer 910 and dielectric layer 912 to provide electrical connections to MIM capacitor having capacitor bottom electrode 320, capacitor dielectric 850, and capacitor top electrode 820. Interlayer dielectric layer 910 can be formed using undoped silica glass (USG), fluorinated silica glass (FSG), a low k material, an extremely low-k dielectric, other suitable materials, or combinations thereof. Any suitable deposition process can be used to form interlayer dielectric layer 910, such as PVD, ALD, MBE, HDPCVD, MOCVD, RPCVD, PECVD, plating, or combinations thereof. A thickness of interlayer dielectric layer 910 can be in a range from about 5000 Å to about 10,000 Å. Dielectric layer 912 is formed on interlayer dielectric layer 910. In some embodiments, dielectric layer 912 can be formed using the same material as interlayer dielectric layer 910. In some embodiments, the materials of interlayer dielectric layer 910 and dielectric layer 912 can be different from each other. Openings are formed in interlayer dielectric layer 910 and filled with conductive material to form electrical connections that respectively connect to capacitor top and bottom electrodes. In some embodiments, the width of the openings can be in a range from about 0.1 µm to about 0.6 µm (e.g., 0.1 µm to 0.6 µm). In some embodiments, the width of the opening can be in a range from about 0.3 µm to about 0.4 µm (e.g., 0.3 µm to 0.4 µm). First and second contacts 901 and 905 are formed by filling the openings with conductive material, such as copper, aluminum, tungsten, cobalt, other suitable conductive material, or combinations thereof. First and second contacts 901 and 905 can be vias formed in interlayer dielectric layer 910 and electrically coupled to capacitor top and bottom electrodes 820 and 320, respectively. In some embodiments, first and second contacts 901 and 905 can extend into capacitor top and bottom electrodes 820 and 320 as illustrated in FIG. 9. In some embodiments, first and second contacts 901 and 905 can be in physical contact and form electrical connections with top surfaces of capacitor top and bottom electrodes 820 and 320.

Various embodiments in accordance with this disclosure provide mechanisms of forming a MIM capacitor structure having high breakdown voltages (e.g., above about 25 V). According to the present disclosure, the MIM capacitor can have one or more blocking layers embedded in the capacitor dielectric layers configured to prevent current leakage paths from causing capacitor breakdowns. In some embodiments, the blocking layers can be one or more oxygen-rich nitride layers that are embedded between capacitor dielectric layers. Without modifying the etching process of the capacitor top electrode, the blocking layers prevent current leakage paths formed by conductive ions embedded at the capacitor dielectric interface during over-etching of the capacitor top electrode.

In some embodiments, an apparatus includes a bottom electrode and a dielectric structure. The dielectric structure includes a first dielectric layer on the bottom electrode and the first dielectric layer has a first thickness. The apparatus also includes a blocking layer on the first dielectric layer and a second dielectric layer on the blocking layer. The second dielectric layer has a second thickness that is less than the first thickness. The apparatus further includes a top electrode over the dielectric structure.

In some embodiments, a capacitor structure includes a capacitor bottom electrode and a capacitor dielectric structure. The capacitor dielectric structure includes a first dielectric layer on the capacitor bottom electrode, the first dielectric layer has a first thickness. The capacitor structure also includes a first blocking layer on the first dielectric layer and a second dielectric layer on the first blocking layer. The second dielectric layer has a second thickness that is less than the first thickness. The capacitor structure also includes a second blocking layer on the second dielectric layer and a capacitor top electrode over the capacitor dielectric structure. The capacitor structure also includes an interlayer dielectric layer formed on the capacitor dielectric structure and the capacitor top electrode. A first contact is formed in the interlayer dielectric and electrically coupled to the capacitor top electrode. A second contact is formed in the interlayer dielectric and electrically coupled to the capacitor bottom electrode.

In some embodiments, a method for forming a capacitor structure includes forming a capacitor bottom electrode and depositing a first dielectric layer on the capacitor bottom electrode. The method includes converting a portion of the first dielectric layer into a first oxygen-rich layer and depositing a second dielectric layer on the first oxygen-rich layer. The method also includes converting a portion of the second dielectric layer into a second oxygen-rich layer and depositing a capacitor top electrode material on the second oxygen-rich layer. The method further includes removing portions of the capacitor top electrode material, portions of the second oxygen-rich layer, and portions of the second dielectric layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a capacitor structure, comprising:
forming a capacitor bottom electrode;
depositing a first dielectric layer on the capacitor bottom electrode;
converting a portion of the first dielectric layer into a first oxygen-rich layer;
depositing a second dielectric layer on the first oxygen-rich layer;
converting a portion of the second dielectric layer into a second oxygen-rich layer;
depositing a capacitor top electrode material on the second oxygen-rich layer; and
removing portions of the capacitor top electrode material, portions of the second oxygen-rich layer, and portions of the second dielectric layer.

2. The method of claim 1, wherein the converting the portions of the first and second dielectric layers comprises performing a plasma treatment using oxygen-containing precursors on the first and second dielectric layers, respectively.

3. The method of claim 2, wherein the oxygen-containing precursors comprise oxygen or nitrous oxide ($N_2O$).

4. The method of claim 1, wherein the removing comprises stopping an etching process before the first oxygen-rich layer is exposed.

5. The method of claim 1, wherein the depositing the first and second dielectric layers comprise depositing silicon nitride.

6. A method, comprising:
forming a capacitor bottom electrode;
depositing a first dielectric layer on the capacitor bottom electrode;
performing a first oxygen plasma treatment on the first dielectric layer to increase an oxygen atomic concentration of a top portion of the first dielectric layer;
depositing a second dielectric layer on the top portion of the first dielectric layer;
performing a second oxygen plasma treatment on the second dielectric layer to increase an oxygen atomic concentration of a top portion of the second dielectric layer;
depositing a capacitor top electrode on the top portion of the second dielectric layer; and
forming interconnect structures, comprising:
forming a first contact in direct contact with the capacitor top electrode; and
forming a second contact in direct contact with the capacitor bottom electrode.

7. The method of claim 6, further comprising removing portions of the capacitor top electrode and portions of the second dielectric layer without exposing the first dielectric layer.

8. The method of claim 6, further comprising etching the second dielectric layer to form sloped sidewalls in the second dielectric layer, and wherein an angle between the sloped sidewalls and a horizontal direction is between about 70° and about 89°.

9. The method of claim 8, wherein the second dielectric layer comprises substantially planar portions abutting the sloped sidewalls.

10. The apparatus of claim 6, wherein depositing the first and second dielectric layers comprises depositing a silicon nitride material.

11. The method of claim 6, wherein performing the first oxygen plasma treatment comprises non-uniformly increasing the oxygen atomic concentration of the top portion of the first dielectric layer.

12. The method of claim 11, wherein the oxygen atomic concentration is greater at a top surface of the top portion than at a bottom surface of the top portion.

13. The method of claim 6, wherein forming the second contact comprises forming a via extending through the second dielectric layer and the top portion of the first dielectric layer.

14. The method of claim 6, wherein forming the capacitor bottom electrode comprises:
depositing a first tantalum nitride layer;
depositing an aluminum copper alloy layer on the first tantalum nitride layer; and
depositing a second tantalum nitride layer on the aluminum copper alloy layer.

15. The method of claim 6, further comprising depositing an interlayer dielectric layer in direct contact with the second dielectric layer and the capacitor top electrode.

16. A method, comprising:
depositing a capacitor bottom electrode;
depositing a dielectric layer stack on the capacitor bottom electrode, comprising:
depositing a first dielectric layer on the capacitor bottom electrode, the first dielectric layer having a first thickness;
increasing an oxygen atomic concentration of a top portion of the first dielectric layer to form a first blocking layer comprising the top portion of the first dielectric layer;
depositing a second dielectric layer on the first blocking layer, the second dielectric layer having a second thickness that is less than the first thickness; and
increasing an oxygen atomic concentration a top portion of the second dielectric layer to form a second blocking layer comprising the top portion of the second dielectric layer; and
depositing a capacitor top electrode on the dielectric layer stack.

17. The method of claim 16, further comprising depositing an interlayer dielectric layer in direct contact with the capacitor top electrode and the dielectric layer stack.

18. The method of claim 17, further comprising:
forming a first contact in the interlayer dielectric layer and electrically coupling the first contact to the capacitor top electrode; and forming a second contact in the interlayer dielectric layer and electrically coupling the second contact to the capacitor bottom electrode.

19. The method of claim 16, wherein increasing the oxygen atomic concentration of the top portion of forming the first dielectric layer comprises performing a plasma treatment using oxygen-containing precursors on the first dielectric layer.

20. The method of claim 16, further comprising:
etching portions of the capacitor top electrode, the second blocking layer, and the second dielectric layer without exposing the first blocking layer; and
depositing an interlayer dielectric layer directly on unetched portions of the second dielectric layer.

\* \* \* \* \*